United States Patent [19]

Gaku et al.

[11] Patent Number: 4,780,507
[45] Date of Patent: Oct. 25, 1988

[54] CURABLE THERMOSETTING CYANATE ESTER COMPOSITION

[75] Inventors: Morio Gaku, Saitama; Hidenori Kimbara, Tokyo; Hiroo Muramoto, Chiba; Shiro Higashida, Chiba; Fumio Sato, Chiba, all of Japan

[73] Assignees: Mitsubishi Gas Chemical Co. Inc.; Nippon Soda Co. Ltd, both of Tokyo, Japan

[21] Appl. No.: 939,772

[22] PCT Filed: Apr. 9, 1986

[86] PCT No.: PCT/JP86/00173

§ 371 Date: Nov. 14, 1986

§ 102(e) Date: Nov. 14, 1986

[87] PCT Pub. No.: WO86/06085

PCT Pub. Date: Oct. 23, 1986

[30] Foreign Application Priority Data

Apr. 9, 1985 [JP] Japan .................................. 60-75006
Mar. 6, 1986 [JP] Japan .................................. 61-47434

[51] Int. Cl.$^4$ ........................ C08L 25/10; C08L 02/00
[52] U.S. Cl. .................................... 525/113; 525/65; 525/66; 525/92; 525/331.9; 525/374; 525/404; 525/407; 525/523; 428/417; 428/418; 428/461; 428/441; 524/404; 524/425; 524/509; 524/456; 523/466

[58] Field of Search ............... 525/331.9, 332.51, 374, 525/523, 607, 404, 407, 65.66, 92, 113; 428/417, 418

[56] References Cited

U.S. PATENT DOCUMENTS 4,110,364  8/1978  Gaku et al. .................... 328/170
4,396,679  8/1983  Gaku et al. .................... 428/412
4,403,073  9/1983  Ikeguchi ........................ 525/374
4,585,855  9/1986  Gaku et al. .................... 525/374

Primary Examiner—Allan M. Lieberman
Attorney, Agent, or Firm—Browdy and Neimark

[57] ABSTRACT

There is disclosed a thermosetting resin composition comprising a thermosetting cyanate ester resin composition (A) and a butadiene based copolymer (B)(i) or an epoxy resin-modified butadiene based copolymer (B)(ii), in which said component (B)(i) or (B)(ii) are used for modifying said component (A), component (A) and (B) being as follows;

(A) a cyanate ester thermosetting resin composition comprising a cyanate ester compound selected from the group consisting of,
  (i) a polyfunctional cyanate ester having at least two cyanate group in its molecule,
  (ii) prepolymer of the cyanate ester of (i),
  (iii) coprepolymer of the cyanate ester of (i) and an amine, and
  (iv) mixtures thereof, and optionally adding another thermosetting resin, (B)(i) a butadiene based copolymer comprising a butadienaromatic vinytl monomer copolymer having 0.5 or more functional groups selected from a group consisting of carboxyl radical, hydroxyl radical, acid anhydride radical, mercapto radical, epoxy radical and amino radical, and a melting point of 10° C. or more, in which 1,2-type content in butadiene structure of copolymer chain is 50% or more, (ii) an epoxy resin-modified butadiene based copolymer comprising said butadiene based copolymer (B)(i) having a carboxyl radical modified with polyfunctional epoxy resin, and having a melting point of 10° C. or more and an epoxy equivalent of 300–8,000.

9 Claims, No Drawings

CURABLE THERMOSETTING CYANATE ESTER COMPOSITION

DESCRIPTION

1. Technical Field

The present invention relates to a novel curable resin composition which has good handling properties and will provide a cured product having improved heat resistance, bonding properties and electrical characteristics. Because of its good dielectric characteristics, the resin composition of the present invention will find particular use in the manufacture of laminations in printed circuit boards, shaped structural articles and paints requiring low dielectric constant and low dielectric loss tangent.

2. Background Art

The curable resin composition that is used as component (A) in the present invention and which consists essentially of a polyfunctional cyanate ester (a) and/or another thermosetting resin (b) has good handling properties and superior heat resistance and bonding properties but is not completely satisfactory for use in applications where low dielectric constant and low dielectric loss tangent are required. On the other hand, 1,2-polybutadiene based resins are capable of providing cured products having low dielectric constant and low dielectric loss tangent but then their bonding and handling properties are not satisfactory.

With a view to solving this incompartibility problem, compositions made of polyfunctional cyanate esters and 1,2-polybutadiene based resins have been proposed (Japanese Patent Publication (kokai) Nos. 142300/1979 and 98244/1980). However, conventionally liquid 1,2-polybutadiene based resins having molecular weights of about 1,000-5,000 are not highly compartible with the polyfunctional cyanate esters and the resulting viscous compositions are unsuitable for use in applications such as prepregs, molding pellets or powder paint coatings which must be tack-free. A method has been proposed for eliminating this problem by using 1,2-polybutadiene resins having molecular weights of about 100,000 but they are not easy to handle since they do not have high compartibility with the cyanate esters or have high solubility in common solvents. The defect which is common to these prior art methods is that the resulting resin compositions do not have good bonding properties. A method exists that introduces an acid anhydride group into 1,2-polybutadine by attaching maleic anhydride at its double bond (Japanese Patent Publication (kokai) No. 143350/1982); the resin using this modified 1,2-polybutadine exhibits good properties with respect to adhesion and heat resistance but it still has the disadvantage of tackiness.

DISCLOSURE OF INVENTION

The present inventors made concerted efforts to obtain a resin composition that has appreciably improved handling properties over the prior art products and which is capable of providing tack-free prepregs, powders and molding pellets. As a result, the inventors have found that a novel curable resin composition that has good handling properties and which is capable of providing a cured product having improved adhesion, heat resistance and electrical characteristics can be obtained by modifying the cyanate ester based resin composition with a butadiene based resin which is either a specified copolymer of butadiene and an aromatic vinyl monomer or an epoxy resin modified butadiene based copolymer which is obtained by modifying a certain type of said butadiene-based copolymer with a polyfunctional epoxy resin.

This invention relates to a thermosetting resin composition comprising a thermosetting cyanate ester resin composition (A) and a butadiene based copolymer (B) (i) or an epoxy resin-modified butadiene based copolymer (B) (ii), in which said component (B) (i) or (B) (ii) are used for modifying said component (A), components (A) and (B) being as follows;

(A) a thermosetting cyanate ester resin composition comprising a cyanate ester compound selected from the group consisting of,
  (i) a polyfunctional cyanate ester having at least two cyanato group in its molecule,
  (ii) prepolymer of the cyanate ester (i),
  (iii) coprepolymer of the cyanate ester (i) and an amine, and
  (iv) mixtures thereof, and optionally adding another thermosetting resin, (B) (i) a butadiene based copolymer comprising a butadiene-aromatic vinyl monomer copolymer having 0.5 or more functional groups selected from a group consisting of carboxyl radical, hydroxyl radical, acid anhydride radical, melcapto radical, epoxy radical and amino radical and a melting point of 10° C. or more, in which 1,2-type content in butadiene structure of copolymer chain is 50% or more, or (ii) an epoxy resin-modified based copolymer comprising said carboxyl radicals-containing butadiene based copolymer (B) (i) modified with at least one polyfunctional epoxy resin, and the copolymer (B) (ii) having a melting point of 10° C. or more and an epoxy equivalent of 300–8,000.

DETAILED DESCRIPTION OF THE INVENTION

The cyanate ester thermosetting resin composition (A) contains cyanate ester having the formula (1) as a essential component, and examples of composition (A) include cyanate ester resin (U.S. Pat. Nos. 3,553,244; 3,755,402; 3,740,348, D.E.P.-1,190,184; 1,195,764 etc.), cyanate ester-maleimide resin, cyanate ester-maleimide-epoxy resin (U.S. Pat. No. 4,110,364; D.E.P.-2,512,085 etc.) and cyanate ester-epoxy resin (U.S. Pat. No. 3,562,214; D.E.P.-1,720,663 etc.).

It is preferred the amount of said cyanate ester compound is more than 50% by weight on the basis of the cyanate ester thermosetting resin composition (A).

The polyfunctional cyanate ester having at least two cyanato group in its molecule are represented by the formula:

$$R(OCN)_m \qquad (1)$$

wherein R is an aromatic radical, preferably an aromatic nucleus-containing residue having 1–10 benzene rings selected from the group consisting of a residue derived from an aromatic hydrocarbon selected from the group consisting of benzene, biphenyl and naphthalene, residue derived from a compound in which at least two benzene rings are bonded to each other by a brindging member selected from the group consisting of

wherein $R^1$ and $R^2$ are the same or different and each represents a hydrogen atom or an alkyl group containing 1 to 4 carbon atoms,

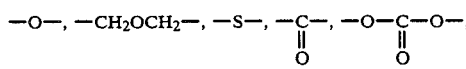

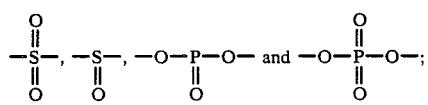

said aromatic nucleus is optionally substituted by a substituent selected from the group consisting of alkyl groups containing 1 to 4 carbon atoms, alkoxy groups, containing 1 to 4 carbon atoms, chlorine and bromine; and m is an integer of at least 2 and preferably 2-5, and the cyanato group is always directly bonded to the aromatic nucleus.

Examples of the polyfuncitonal cyanate ester include 1,3- or 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-dicyanatophenyl)methane; 2,2-bis(4-cyanatophenyl)propane, 2,2-bis(3,5-dichloro-4-cyanatophenyl)propane, 2,2-bis(3,5-dibromo-4-cyanatophenyl)propane; bis(4-cyanatophpenyl)ether; bis(4-cyanatophenyl)thioether; bis(4-cyanatophenyl)sulfone; tris(4-cyanatophenyl)phosphite; tris(4-cyanatophenyl)phosphate; bis(3-chloro-4-cyanatophenyl)methane; a cyanate ester obtained by reacting a novolak with a halogenated cyanide (U.S. Pat. Nos. 4,022,755 and 3,448,079, DE Pat. Nos. 2,533,322 and 1,251,023), and cyanate ester obtained by reacting a bisphenol type polycarbonate and a halogenated cyanide (U.S. Pat. No. 4,026,913, DE Pat. No. 2,611,796). Other cyanate ester compounds employed in the practice of this invention are given in U.S. Pat. Nos. 3,553,244; 3,755,402; 3,740,348; 3,595,900; 3,694,410; and 4,116,946 and British Pat. Nos. 1,305,967 and 1,060,933 which are incorporated herein by reference. A prepolymer having a cyanato group in its molecule which is prepared by polymerizing the above cyanate ester compounds in the presence or absence of, as a catalyst, an acid such as a mineral acid or Lewis acid, a base such as sodium hydroxide, a sodium alcoholate or a salt such as sodium carbonate or lithirium chloride, or phosphate esters, such as tributyl phosphine, can be used as a cyanate ester compound.

Homoprepolymer of the above cyanate ester and coprepolymer of the above cyanate ester and an amine may be used as a cyanate ester compound. Examples of the amines include meta- or para-phenylenediamine, meta- or para-xylylenediamine, 1,4- or 1,3-cyclohexanediamine, hexahydroxylylenediamine, 4,4'-diaminobiphenyl, bis(4-aminophenyl)methane, bis(4-aminophenyl)ether, bis(4-aminophenyl)sulfone, bis(4-amino-3-methylphenyl)methane, bis(4-chloro-4-aminophenyl)methane, bis(4-amino-3,5-dimethylphenyl)methane, bis(4-aminophenyl)cyclohexane, 2,2-bis(4-aminophenyl)propane, 2,2-bis(4-amino-3-methylphenyl)propane, 2,2-bis(3,5-dibromo-4-aminophenyl)propane, bis(4-aminophenyl)phenylmethane, 3,4-diaminophenyl-4'-aminophenylmethane and 1,1-bis(-aminophenyl)-1-phenylethane, bis(4-aminophenyl)diphenyl silane, bis(4-aminophenyl)methyl phosphoneoxide, bis(4-aminophenyl)methyl phosphoneoxide, bis(-aminophenyl)phenyl phosphineoxide, 2,4-diamino-6-phenyl-1,3,5-triazine(benzoguanamine), methylguanamine and butylguanamine.

Mixtures of two or more of the cyanate ester monomers, the prepolymer of the cyanate ester and the coprepolymer of the cyanate ester and an amine may be used. Number average molecular weight of the mixture may be in the range of 300–6,000, preferably 300–1,500 and most preferably 300–1,000.

The preferable maleimide is represented by the following general formula:

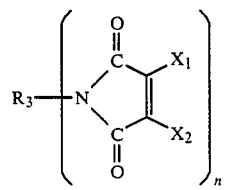

(2)

wherein $R_3$ represents an aromatic, aliphatic or alicyclic organic group having two or more, $X_1$ and $X_2$ are the same or different and are independently a hydrogen atom, halogen atom or lower alkyl group and n is an integer of at least 2 and preferably an integer of 2-5. Oligomers or prepolymers derived fro the above maleimide compounds may be used as the maleimide compound.

The maleimides represented by the above formula (2) can be produced by a method known per se which involves reacting maleic anhydride with polyamine having at least 2 amino groups to form a maleamide acid, and then dehydrocyclizing the maleamide acid.

The maleimide compounds are given in U.S. Pat. No. 4,110,364 which is incorporated herein by reference.

The diamines include aromatic diamines, alicyclic diamines aliphatic diamines. Aromatic diamines are preferable, because the resulting object product has excellent heat resistance. When an alicyclic diamine is used the object products have flexibility. Primary diamines are more preferable to secondary diamines.

The epoxy resins which are usable as one of the components of the thermosetting resin of this invention may be the ones employed as laminates in the prior art. Examples of the epoxy resins include bisphenol A type epoxy resin, bisphenol F type epoxy resin, phenolnovolak type epoxy resin, cresol-novolak type epoxy resin, halogenated bisphenol A type epoxy resin, halogenated phenol-novolak type epoxy resin, polyglycol type epoxy resin and alicyclic type epoxy resin. Mixtures of two or more of these epoxy resins may be used.

The butadiene based copolymer (B) (i) of this invention comprise block or random copolymers with butadiene and an aromatic vinyl monomer, and have 0.5 or more, preferably 1–4 functional groups selected from the group consisting of hydroxyl radical, carboxyl radical, acid anhydride radical, epoxy radical, mercapto radical and amino radical in its molecule, and a melting point of more than 10° C., preferably more than 20° C.

The epoxy resin modified butadiene based copolymer (B) (ii) comprises said carboxyl radical-containing butadiene based copolymer in above said butadiene based copolymer (B) (i) with at least one polyfunctional epoxy resin, and have a melting point of more than 10° C., preferably more than 20° C. and an epoxy equivalent of 300–8,000, preferably 500–4,000.

In said butadiene based copolymers, the weight ratio of butadiene/aromatic vinyl monomer of copolymer chain is 80/20–10/90, preferably 70/30–20/80, and 1,2-type of butadiene structure constituting the copolymer chain is 50% or more, preferably 85% or more. The preferable range of the number average molecular weight ($\overline{Mn}$) of said butadiene based copolymer (B) (i) may be between 500 and 20,000.

When the content of butadiene units in the butadiene based copolymer is more than 80% by weight, the miscibility of the thermosetting cyanate ester resin composition (A) with said copolymer is deteriorated, when the content of butadiene unit therein, is less than 10% by weight, the thermal resistance of objective cured product is deteriorated. When 1,2-type in butadiene structure constituting copolymer chain is below 50%, the thermal resistance of objective cured product is deteriorated, too.

When the melting point of the butadiene based copolymer (B) (i) and the epoxy resin-modified butadiene based copolymer (B) (ii) is below 10° C., the objective dry composition is tacky, and the workability of the treatment of the composition is too deteriorative.

When the epoxy equivalent of the epoxy resin-modified butadiene based copolymer (B) (ii) is below 300, the electric properties of the objective cured product are unsatisfuctry, and if it is over 8,000, adhering property of the cured product to metal foil is deteriorated.

As the aromatic vinyl monomers used for copolymerization with butadiene, styrene, α-methyl styrene, vinyl toluene, chloro styrene, p-ethyl styrene, p-methoxy styrene, divinyl benzene and the like or mixtures thereof may be used.

The copolymerization of butadiene and the aromatic vinyl monomer may be carried out through anion polymerization or anion living polymerization (see U.S. Pat. No. 3,488,332 and DE Pat. No. 2 011 561). The anion polymerization means the reaction between butadiene and an aromatic vinyl monomer in the presence of sodium or organic lithium at a temperature of 0°–70° C. However, it is difficult to determine the reaction conditions for keeping the ratio of 1,2-type in butadiene structure constituting the copolymer chain of butadiene-based copolymer to 50% or more. So, anion living polymerization is preferred.

In anion living polymerization where butadiene and an aromatic vinyl monomer are reacted at temperatures no higher than −20° C., the amount of the 1,2-type in the butadiene structure can be readily increased to 80% or higher, and even the copolymer having said 1,2-type of 85–95% can be obtained by setting the polymerization conditions. In addition, a random copolymer is obtained by adding butadiene and a vinyl aromatic monomer to the reaction system simultaneously, while a block copolymer is readily obtained by adding butadiene and aromatic vinyl monomers alternately. A further advantage of the anion living polymerization process is the great ease with which the molecular weight of the copolymer can be controlled.

Butadiene based copolymers having functional groups, such as carboxyl radical, hydroxyl radical, mercapto radical and amino radical at both end of the copolymer are obtained by treating a butadiene-aromatic vinyl monomer copolymer above with carbon dioxide, ethylene oxide, ethylene sulfide or ethylene imine followed by treating the obtained reaction liquor with water or methanol.

A butadiene based copolymer having epoxy radicals as functional group at both end of the copolymer is obtained by treating with epichlorohydrin the copolymerization reaction liquor obtained by the above mentioned process.

A butadiene based copolymer having acid anhydride radicals as functional group at a part of copolymer chain is obtained by adding ethylene-α,β-dicarboxy compound such as maleic anhydride, methyl maleic anhydride, to double bonds of a butadiene-aromatic vinyl monomer copolymer not having a functional group which is obtained by treating with water or methanol the copolymerization reaction liquor obtained by the above mentioned process.

A butadiene based copolymer having carboxyl radicals or hydroxyl radicals at a part of copolymer chain is obtained by treating with air or $O_2$ a butadiene-aromatic vinyl copolymer having or not having funcitonal group.

A butadiene based copolymer having epoxy radicals at a part of 1,2-type in butadiene structure of copolymer chain is obtained by treating with an organic per-acid such as peracetic acid, perpropionic acid a butadiene-aromatic vinyl monomer copolymer not having a functional group.

A butadiene based copolymer having carboxyl radicals is obtained by half-esterifying process in which carboxyl-radicals are introduced by half-esterifying with a dibasic acid anhydride such as maleic anhydride, phthalic anhydride, 4-methyl hexahydro phthalic anhydride, dodecyl succinic anhydride, trimellitic anhydride or the like a part or all part of hydroxyl radicals at end of butadiene-aromatic vinyl monomer copolymer obtained by the above mentioned process, and is also obtained by half-esterifying and ring-opening with hydroxyl radicals containing compound such as butanol, ethyl cellosolve, allyl alcohol, 2-hydroxyethyl metaacrylate, ethylene glycol, phenol or the like a part or all part of acid anhydride radicals of butadiene-aromatic vinyl monomer copolymer having acid anhydride radicals in a part of copolymer chain obtained above said process.

The epoxy resin-modified butadiene based copolymer (B) (ii) is obtained by reacting at least one polyfunctional epoxy resin with butadiene based copolymer having carboxyl radicals obtained by the above mentioned process for preparing the butadiene based copolymer (B) (i).

The ratio of equivalent of the epoxy radical in the epoxy resin to equivalent of carboxyl radical in the butadiene based copolymer is between 1.8 and 20, preferably 2.0 and 15.

As epoxy resins, bisphenol A type epoxy resin, bisphenol F type epoxy resin, hydrogenated bisphenol A type epoxy resin, phenol-novolak type epoxy resin, cresol-novolak type epoxy resin, urethane-modified epoxy resin, alioyelic type epoxy resin, glycidyl amine type epoxy resin, isocyanurate type epoxy resin, halogenated bisphenol A type epoxy resin, halogenated phenol-novolak type epoxy resin or the like or mixtures thereof may be used.

As reaction solvents, an organic solvent such as, for example, hydrocarbon solvent such as benzene, toluene and the like, chlorinated hydrocarbon solvent such as carbon tetrachloride, molochloro benzene and the like, ketones such as acetone, methyl ethyl ketone and the like, esters such as ethyl acetate, butyl acetate and the like, ethers such as dioxane and the like, tetrahydrofuran, dimethyl formamide and the like or a mixture thereof may be used.

The methods for blending the thermosetting resin (A) and the copolymer (B) (i) or the copolymer (B) (ii) may be conventional methods. Examples of the methods are as follows:

(i) a method for blending them by heating them in the absence of a solvent, (ii) a method for blending them by preliminarily reacting them in the absence of a solvent, (iii) a method for blending them in an organic solvent, such as acetone, methyl ethyl ketone, methyl isobutyl ketone, toluene, xylene or the like, (iv) a method for blending them by preliminarily reacting them in the above-mentioned solvent, and (v) a method comprising separately prepolymerizing the thermosetting resin the copolymer, respectively, in the presence of the solvent and blending the resulting prepolymers.

The proportion of component (A) to component (B) (i) or (B) (ii) is not critical. In general, the proportion may be in the range of 95:5 to 30:70, preferably 90:10 to 40:60, and most preferably 80:20 to 50:50.

The thermosetting resin of the present invention may contain synthetic or natural resins, fiberous reinforcers, fillers, dyestuffs, pigments, thickeners, lubricants, coupling agents, self-extinguishing agents and the like in order to modify the properties of the thermosetting resin.

Examples of the synthetic or natural resins for changing the properties of the thermosetting resin include thermosetting resins, such as polyester resin, phenol resin, acrylic resin, urethane resin, silicone resin and alkyd resin; unvulcanized rubbers, such as polybutadiene, butadiene-acrylonitrile copolymer, polychloroprene butadiene-styrene copolymer, polyisoprene, butyl rubber, natural rubbers; thermoplastic resins or low molecular resin having a molecular weight of less than several thousands, such as thermoplastic urethane resin, polyvinyl acetal resin and vinyl acetate resin; oligomers having a molecular weight of less than several thousands, such as polycarbonate, thermoplastic polyester, polyester-carbonate, polyphenylene ether, polyslfone, polyether sulfone, and polyacrylate which are engineering plastics; polyolefins having a molecular weight of less than several thousands, such as polyethylene, polypropylene, polybutene, and poly-4-methylpentene-1; and fluoroplastics having an molecular weight of less than several thousands, such as polytetrafluoro ethylene, tetrafluoro-propylene copolymer, perfluoroethylene-propylene copolymer, and fluoro-vinylidene.

Examples of fillers include silica powder, such as fused silica and crystalline silica boron-nitride powder and boron-silicate powders for obtaining cured products having low dielectric constant and low dielectric loss tangent; the above-mentioned powder as well as alumina, and magnesium oxide (or magnesia) for high temperature conductivity; and inorganic fillers, such as wollastonite, mica, calcium carbonate and talc. These inorganic fillers can be added to the thermosetting resin without any treatment, or after surface treatment by a silane coupling agent, or a titanate coupling agent. The fillers can be used in the form of particles or fiber. Examples of reinforcers include fabric reinforcements, such as roving, chopped strand mat, continuous mat, cloth, roving cloth and surfacing mat for obtaining resin impregnated laminates; and fibers, such as glass fiber, quartz fiber, graphite fiber, aromatic amide fiber, and mixtures thereof. Organic fillers can be used instead of part of the inorganic fillers in order to improve workability and flexibility of the cured product. Examples of organic fillers include powdery engineering resins, such as polycarbonate, thermoplastic polyester, polyester-carbonate, polyphenylene ether, polysulfone, polyether sulfone, and polyacrylate; powdery polyolefins, such as polyethylene, polypropylene and poly-4-methyl pentene-1; and fluoroplastics, such as polytetrafluoro ethylene, tetrafluoroethylenerpropylene copolymer, and perfluoroethylene-propylene copolymer.

The thermosetting resins of the present invention may contain a catalyst or catalysts or accelerating cross-linking reaction of components (A) and (B). Suitable catalysts include amines, imidazoles, organic metal salts, inorganic metal salts, and organic peroxides. Of these catalysts, an organic metal salt or a mixture of an organic metal salt and an organic peroxide is preferred.

Examples of organic metal salts include zinc naphthenate, lead stearate, lead naphthenate, zinc octoate, tin oleate, tin octoate, dibutyl tin maleate, manganese naphthenate, cobalt naphthenate, iron acetyl acetonate, and manganese acetyl acetonate.

Examples of organic peroxides include diacyl peroxides, such as benzoyl peroxide, 2,4-dichloro benzoyl peroxide, octanoyl peroxide, and lauroyl peroxide; dialkyl peroxides, such as di-t-butyl peroxide, 2,5-dimethyl-2,5-di(t-butyl peroxy)hexene-3, and dicumyl peroxide; peroxy esters, such as t-butyl perbanzoate, t-butyl peracetate, di-t-butyl perphthalate, and 2,5-dimethyl-2,5-di(benzoyl peroxy)hexane; ketone peroxides, such as methyl ethyl ketone peroxide, and cyclohexanone peroxide; hydro peroxides, such as di-t-butyl hydroperoxide, cumene hydroperoxide, α-phenyl ethyl hydroperoxide, and cyclohexenyl hydroperoxide; peroxy ketals, such as 1,1-bis(t-butylperoxy)cyclohexane, and 1,1-bis(t-butylperoxy)-3,3,5-trimethylcyclohexane. The amount of catalyst employed may be less than 10% by weight, preferably less than 5% by weight, on the basis of the total resin composition.

The thermosetting resins of the present invention can be used for various purposes. When they are used as moldings, laminates, and the like, the composition may be used under a pressure of 0.1 kg–1000 kg/cm$^2$, preferably 3–500 kg/cm$^2$ and at a temperature of 100°–300° C., preferably 160°–240° C. The period for curing the resin composition may be in the range of 30 seconds–30 hours. The resin compositions are cured for a short time, for example 30 seconds–100 minutes, or for relatively low temperatures, the product withdrawn from the molding machine may be post-cured in an oven.

The present invention is further illustrated by the following non-limiting Reference Example, Examples and Comparative runs.

All percentages and parts in these Examples and Comparative runs are by weight, unless otherwise specified.

REFERENCE EXAMPLE A

Preparation of thermosetting resin composition

Homoprepolymer of 2,2-bis(4-cyanatophenyl)propane (hereinunder referred to as BPCN), and coprepolymer of BPCN and bis(4-maleimidophenyl)methane (hereinunder referred to as BMI) were prepared as shown in Table A.

TABLE A

|  |  | A1 | A2 | A3 | A4 | A5 | A6 |
|---|---|---|---|---|---|---|---|
| starting material parts | BPCN | 100 | 90 | 85 | 70 | 60 | 60 |
|  | BMI |  | 10 | 15 | 30 | 40 | 40 |
| polymerization temperature | °C. | 160 | 150 | 140 | 140 | 145 | 140 |
| polymerization time | hrs. | 4 | 4 | 4 | 4 | 4 | 4 |
| number average molecular weight | $\overline{Mn}$ | 680 | 660 | 600 | 550 | 600 | 560 |

REFRENCE EXAMPLE B1

Preparation of butadiene based copolymer (B) (i)

Butadiene (hereinunder referred to as Bu), and styrene (hereinunder referred to as St) or α-methyl stylene (hereinunder referred to as αST) were polymerized through anion living polymerization; and the resulting copolymers were post-treated by a well known method to form functional group-containing butadiene-aromatic vinyl monomer copolymers (B1–B5M).
The results are shown in Table B1.

Bu and St or αSt were copolymerized through anion living polymerization. The resulting butadiene-aromatic vinyl monomer copolymers (hereinunder referred to as CP-BS) were treated as in the following to obtain carboxy-containing copolymer (C1–C7).

C1–C3 were obtained by reacting CP-BS with carbon dioxide [post-treatment (1)] and had carboxy group at the end.

C4–C6 were obtained by reacting CP-BS with ethylene oxide to introduce hydroxy group at the end thereof, followed by half-esterifying the hydroxy group of the copolymer with 4-methylhexahydro phthalic anhydride or maleic anhydride [post-treatment (2)].

C7 was obtained by reacting adduct of CP-BS having no functional group with maleic anhydride in methyl isobutyl ketone and had carboxy group on a portion not being the end point [post-treatment (3)].

The results are shown in Table b". CB2 in Table B means commercially available carboxy-containing butadiene homopolymer (NISSO-PBC-1,000 (trade name), viscosity of 75 poise/45° C., 1,2-type in Bu of 90.5%, Mn 1310, acid value 64.2, Nippon Soda Kabushiki Kaisha).

TABLE B"

|  | C1 | C2 | C3 | C4 | C5 | C6 | C7 | CB2 |
|---|---|---|---|---|---|---|---|---|
| copolymer type | block | block | random | block | block of Bu | random | block | homopolymer |
| $\overline{Mn}$ | 2050 | 3450 | 1730 | 1930 | 1810 | 2880 | 1980 | 1310 |
| aromatic vinyl monomer (St or αSt) | αSt | αSt | St | αSt | St | St | αSt | — |
| Bu percent | 49.8 | 58.2 | 39.0 | 49.4 | 39.2 | 29.2 | 49.5 | 100 |
| 1,2-type in Bu unit % | 90.3 | 89.8 | 89.7 | 90.1 | 90.0 | 90.4 | 91.2 | 90.5 |
| post-treatment | 1 *1 | 1 *1 | 1 *1 | 2 *2 | 2 *3 | 2 *3 | 3 *4 | — |
| acid value | 43.8 | 26.0 | 51.9 | 20.8 | 28.4 | 18.4 | 25.6 | 64.2 |
| melting point °C. | 68 | 57 | 69 | 68 | 68 | 78 | 68 | — |

*1 carboxylation by $CO_2$
*2 half esterification by 4-methylhexahydro phthalic anhydride
*3 half esterification by maleic anhydride
*4 half esterification by adduct of copolymer and maleic anhydride CB1 in Table B1 means copolymer in which 1,2-type is less than 50%.

TABLE B1

|  | B1 | B2 | B3 | B4 | B5M*1 | CB1 |
|---|---|---|---|---|---|---|
| copolymer type | block | random | block | random | block | block |
| $\overline{Mn}$ | 2,100 | 2,520 | 3,480 | 2,880 | 1,980 | 2,280 |
| portion of Bu unit | 49.8 | 39.8 | 39.1 | 29.7 | 49.4 | 48.8 |
| 1,2-type in Bu unit | 90.5 | 91.3 | 89.4 | 91.5 | 90.0 | 31.3 |
| 1,4-type in Bu unit | 9.5 | 8.7 | 10.6 | 8.5 | 10.0 | 68.7 |
| vinyl monomer | αSt | St | αSt | St | αSt | St |
| post-treatment | epichlorohydrin | ethylene oxide plus hydrolysis | propylene oxide plus hydrolysis | $CO_2$ plus hydrolysis | hydrolysis plus maleic anhydride | epichlorohydrin |
| epoxy equivalent | 1,250 |  |  |  |  | 2,850 |
| hydroxy value |  | 40.1 | 28.9 |  |  |  |
| acid value |  |  |  | 35.1 |  |  |
| total acid value |  |  |  |  | 53.7 |  |
| half acid value |  |  |  |  | 28.5 |  |
| melting point °C. | 62 | 66 | 75 | 78 | 61 | 56 |

*1 Copolymer before treatment with maleic anhydride is called CB5

REFERENCE EXAMPLE B2

Preparation of epoxy resin-modified butadiene based copolymer (B) (ii)

(i) preparation of carboxy-containing butadiene based copolymer (C1–C7)

Epoxy resin-modified butadiene based copolymers (BE1–BE7 and CE1) were obtained by reacting each of C1–C7 and CB2 with epoxy resin. The reaction conditions and properties of the copolymer are shown in Table B2.

TABLE B2

| | | Sample | | | | | | | |
|---|---|---|---|---|---|---|---|---|---|
| | | BE1 | BE2 | BE3 | BE4 | BE5 | BE6 | BE7 | CE1 |
| copolymer | kind | C1 | C2 | C3 | C4 | C5 | C6 | C7 | CB2 |
| | part | 100 | 100 | 100 | 100 | 100 | 100 | 100 | 100 |
| epoxy resin*[1] | YDCN-701 | 50 | 50 | 50 | 20 | | | | 50 |
| parts | YDPN-601 | | | | | 20 | | 50 | |
| | YD-128 | | | | | | 20 | | |
| methyl ethyl ketone parts | | 150 | | | 120 | | | | 150 |
| methyl isobutyl ketone parts | | | 150 | 150 | | 120 | 120 | 150 | |
| benzyl dimethyl amine parts | | 0.2 | 0.2 | 0.2 | 0.2 | 0.2 | 0.2 | 0.2 | 0.2 |
| hydroquinone parts | | 0.05 | 0.05 | 0.05 | 0.05 | 0.05 | 0.05 | 0.05 | 0.05 |
| reaction | temp. °C. | 80–85 | 110–115 | 110–115 | 80–85 | 110–115 | 110–115 | 110–115 | 80–85 |
| | time hrs. | 8 | 3 | 3 | 8 | 3 | 3 | 3 | 8 |
| properties of resin | melting point °C. | 71 | 62 | 74 | 70 | 69 | 64 | 74 | <10 |
| | epoxy equivalent | 904 | 782 | 1028 | 2208 | 1890 | 1600 | 666 | 1230 |

*[1]YDCN-701 (trade name) (Toto Chemical Co., Ltd. cresol-novolak type epoxy resin, epoxy equivalent, 205)
YDPN-601 (trade name) (Toto Chemical Co., Ltd. cresol-novolak type epoxy resin, epoxy equivalent, 185)
YD-128 (trade name) (Toto Chemical Co., Ltd. bisphenol A type resin, epoxy equivalent, 190)

EXAMPLES 1–5 AND COMPARATIVE RUNS 1–7

Components prepared in the above Examples, α,ω-1,2-polybutadiene [Nippon Soda NISSO-PB-G-3000 (trade name) (hereinunder referred to as PBG3)] and other components were blended as shown in Table 1 to obtain varnishes.

The varnish was impregnated in a plain weave E glass fabric 0.2 mm thick and heat-dried to a B-stage prepreg.

Eight layers of the resulting prepregs were sandwiched between two electrolytic copper foils 35 μm thick, and pressed at 180° C., 50 kg/cm² for 120 minutes. The product of Example 3 was post-cured at 200° C. for 24 hours.

TABLE 1

| | component (solid) | | | | | other additives | | catalyst | | | |
|---|---|---|---|---|---|---|---|---|---|---|---|
| | | | | ratio of A/B | | | | zinc | peroxide | | |
| | A | B | | | solvent | kind | parts | octoate | kind | parts | |
| Example | | | | | | | | | | | |
| 1 | A1 | B1 | 100 | 80/20 | MEK | | | 0.05 | PO1 | 1 | |
| 2 | A2 | B2 | " | " | acetone | | | " | PO3 | 1 | |
| 3 | A6 | B3 | " | 60/40 | MEK | EP438 | 2 | 0.03 | PO2 | 1 | |
| 4 | BPCN/BMI | B4 | 88 | 61/7/20 | acetone | BrPC | 12 | 0.04 | PO3 | 1 | *[1] |
| | | | | | | EP152 | 5 | | | | |
| 5 | A2 | B5M | 100 | 80/20 | " | | | " | " | 1 | |
| Comparative run | | | | | | | | | | | |
| 1 | A1 | | 100 | 100/0 | MEK | | | 0.05 | PO1 | 1 | |
| 2 | A2 | | " | " | acetone | | | " | PO3 | 1 | |
| 3 | | B1 | " | 0/100 | MEK | | | | PO1 | 1 | |
| 4 | A1 | CB1 | " | 80/20 | " | | | 0.05 | PO1 | 1 | |
| 5 | A1 | PBG3 | " | " | acetone | | | " | PO1 | 1 | *[2] |
| 6 | A2 | CB5 | " | " | " | | | " | PO1 | 1 | |
| 7 | A2 | CB1 | " | " | " | | | " | PO1 | 1 | |

BrPC polycarbonate oligomer (degree of polymerization N̄ 4.2) of tribromophenol-terminated tetrabromo bisphenol A
EP438 novolak type epoxy resin (Dow Chemical, DEN-438 trade name)
EP152 novolak type epoxy resin (YUKA Shell Epoxy Kabushiki Kaish, Epikote 152)
*[1]resin composition obtained by preliminarily reacting BPCN/BMI/B4/hydroquinone (61/7/20/0.1) at 130° C. for 4 hours, followed by adding BrPC and BP152 to the resulting prepolymer.
*[2]When the composition was blended with acetone, turbidity occurred. Impregnation was carried out while stirring the varnish.
PO1 1,1-bis(t-butylperoxy)-3,3,5-trimethylcyclohexane
PO2 dicumyl peroxide
PO3 2,5-dimethyl-2,5-di(t-butylperoxy)hexane-3

The properties of the resulting copper clad laminates are shown in Table 2.

TABLE 2

| | laminate-molding conditions | | | dielectric constant 25° C. 1 MHz | dielectric loss tangent 25° C. 1 MHz | glass transition temperature (°C.) | copper peel strength (kg/cm) | solder resistance*[1] | solvent resistance*[2] |
|---|---|---|---|---|---|---|---|---|---|
| | °C. | kg/cm² | min. | | | | | | |
| Example | | | | | | | | | |
| 1 | 180 | 50 | 120 | 3.6 | 0.0030 | 182 | 1.6 | O | O |
| 2 | " | " | " | 3.6 | 0.0030 | 194 | 1.5 | O | O |
| 3 | " | " | " | 3.6 | 0.0040 | 190 | 1.3 | O | O |
| | plus post-curing at 200° C. for 24 hrs. | | | | | | | | |
| 4 | 180 | 50 | 120 | 3.9 | 0.0030 | 191 | 1.5 | O | O |
| 5 | " | " | " | 3.7 | 0.0030 | 198 | 1.6 | O | O |

TABLE 2-continued

| | laminate-molding conditions | | | dielectric constant 25° C. 1 MHz | dielectric loss tangent 25° C. 1 MHz | glass transition temperature (°C.) | copper peel strength (kg/cm) | solder resist- ance*[1] | solvent resist- ance*[2] |
|---|---|---|---|---|---|---|---|---|---|
| | °C. | kg/cm² | min. | | | | | | |
| Comparative run | | | | | | | | | |
| 1 | 180 | 50 | 120 | 4.2 | 0.0030 | 186 | 1.8 | O | O |
| 2 | " | " | " | 4.2 | 0.0030 | 195 | 1.7 | O | O |
| 3 | " | " | " | 3.4 | 0.0080 | 103 | 0.4 | X | X |
| 4 | " | " | " | 3.7 | 0.0030 | 91 | 0.8 | X | X |
| 5 | Since the resulting prepreg was too tacky, laminate-molding was impossible. | | | | | | | | |
| 6 | 180 | 50 | 120 | 3.6 | 0.0030 | 133 | 0.5 | X | X |
| 7 | " | " | " | 3.6 | 0.0030 | 136 | 1.5 | X | X |

*[1]treatment at 300° C. for 2 min. O, no damage; X, blistering
*[2]boiling in trichloroethane for 15 min. O, no damage; X, rough surface

EXAMPLE 6

A5 (80 parts), B2 (20 parts) and iron acetyl acetonate (0.1 part) and di-t-butyl peroxide (2 parts) as a catalyst were blended. Wollastnite (100 parts) was added to the resulting mixture. Pellets of the composition were formed by a kneading type extrude at 100°–110° C. The pellets had excellent blocking resistance.

The pellets were compression-molded at 300 kg/cm² and 170° C. for 3 minutes; and the resulting molding was postcured at 200° C. for 30 minutes in an oven.

The properties of the molding were as follows:
glass transition temperature: 185° C.
flexural strength: 8.1 kg/mm² (at 25° C.) and 4.1 kg/mm² (at 175° C.)
weight loss by heating: 0.8% (at 220° C. after 100 hours)

EXAMPLES 7–15 AND COMPARATIVE RUNS 8–16

The above components were blended as shown in Table 3 to form varnishes.

The varnish was impregnated in a plain-weave E glass fabric 0.2 mm thick and heat-dried to a B-stage prepreg. Except in Example 13, eight layers of this prepreg were stacked and sandwiched between two sheets of electrolytic copper foil each having a thickness of 35 μm. The assembly was pressed at 180° C., 50 kg/cm² for 120 minutes to form copper-clad laminates. In Example 13, the varnish was impregnated in a nonwoven glass fabric 0.2 mm thick and heat-dried to form a B-stage prepreg (P). The varnish was impregnated in a plain-weave E glass fabric 0.2 mm thick and heat-dried to a B-stage prepreg (Q). Six layers of this prepreg (P) were stacked, and sandwiched between two prepregs (Q) and overlaid with an electrolytic copper foil. The stack was subsequently treated as in the other Examples.

In Example 10 to 15 and Comparative run 11, the copper-clad laminates post-cured at 200° C. for 24 hours.

The specific conditions of lamination and the characteristics of the resulting copper-clad laminates are shown in Table 4.

TABLE 3

| | component (solid) | | | | | other additives | | catalyst | | | |
|---|---|---|---|---|---|---|---|---|---|---|---|
| | A | B | A + B parts | A/B ratio | solvent | kind | part | zinc octoate | peroxide kind | part | AMI part |
| Example | | | | | | | | | | | |
| 7 | A1 | BE1 | 100 | 2/1 | MEK | | | 0.05 | PO1 | 2 | |
| 8 | A2 | BE2 | " | " | " | | | " | " | " | |
| 9 | A3 | BE3 | " | " | " | | | " | " | " | |
| 10 | A4 | BE4 | " | 1/1 | " | | | " | PO2 | 2 | |
| 11 | " | " | " | 2/1 | " | | | " | " | " | |
| 12 | " | " | " | 4/1 | " | | | " | " | " | |
| 13 | " | " | " | 2/1 | " | fused silica | 30 | " | " | " | |
| 14 | A5 | BE5 | 85 | " | acetone | BrPC | 15 | " | PO4 PO5 | 1 1 | |
| 15 | " | BE6 | 85 | 10/3 | " | " | 15 | " | " | " | *1 |
| Comparative run | | | | | | | | | | | |
| 8 | A1 | | 100 | 1/0 | MEK | | | 0.05 | PO1 | 2 | |
| 9 | A2 | | " | " | " | | | " | " | " | |
| 10 | A3 | | " | " | " | | | " | " | " | |
| 11 | A4 | | " | " | " | | | " | PO2 | 2 | |
| 12 | | BE1 | " | 0/1 | | | | | PO1 | 2 | 17 |
| 13 | | BE2 | " | " | | | | | " | " | 20 |
| 14 | | BE3 | " | " | | | | | " | " | 15 |
| 15 | | BE4 | " | " | | | | | " | " | 8 |
| 16 | A1 | CE1 | " | 2/1 | MEK | | | 0.05 | " | " | *2 |

BrPC polycarbonate oligomer (N, 4.2) of tribromophenol-terminated tetrabromobisphenol A
*[1]composition obtained by preliminarily reacting A5 and BE6 at 115° C. for 8 hours
*[2]When the composition was blended with MEK, turbidity occurred. Impregnation was carried out with stirring.
PO4 1,1-bis(t-butylperoxy)cyclohexane
PO5 α,α'-bis(t-butylperoxy-m-isopropyl)benzene
AMI dicyandiamine/methyl cellosolve/dimethylformamide (4/15/15) (dicyandiamide catalyst)

TABLE 4

| | laminate-molding conditions | | | dielectric constant 25° C. 1 MHz | dielectric loss tangent 25° C. 1 MHz | glass transition temp. (°C.) | copper peel strength (kg/cm) | solder resist-ance*1 | solvent resist-ance *2 |
|---|---|---|---|---|---|---|---|---|---|
| | temp. (°C.) | pressure (kg/cm$^2$) | time (min.) | | | | | | |
| Example | | | | | | | | | |
| 7 | 180 | 50 | 120 | 3.6 | 0.0031 | 180 | 1.7 | O | O |
| 8 | " | " | " | 3.6 | 0.0030 | 190 | 1.6 | O | O |
| 9 | " | " | " | 3.6 | 0.0030 | 194 | 1.6 | O | O |
| 10 | " | " | " | 3.5 | 0.0029 | 183 | 1.5 | O | O |
| | plus post-curing at 200° C. for 24 hours | | | | | | | | |
| 11 | 180 | 50 | 120 | 3.6 | 0.0028 | 205 | 1.6 | O | O |
| 12 | " | " | " | 3.7 | 0.0027 | 212 | 1.7 | O | O |
| 13 | " | " | " | 3.2 | 0.0027 | 205 | 1.6 | O | O |
| 14 | " | " | " | 3.9 | 0.0027 | 208 | 1.6 | O | O |
| 15 | " | " | " | 3.8 | 0.0027 | 210 | 1.6 | O | O |
| Comparative run | | | | | | | | | |
| 8 | 180 | 50 | 120 | 4.2 | 0.0035 | 186 | 1.8 | O | O |
| 9 | " | " | " | 4.2 | 0.0030 | 195 | 1.7 | O | O |
| 10 | " | " | " | 4.2 | 0.0028 | 200 | 1.7 | O | O |
| 11 | 180 | 50 | 120 | 4.2 | 0.0026 | 230 | 1.7 | O | · O |
| | plus post-curing at 200° C. for 24 hours | | | | | | | | |
| 12 | 180 | 50 | 120 | 3.4 | 0.0030 | 133 | 1.4 | X | X |
| 13 | " | " | " | 3.4 | 0.0030 | 145 | 1.4 | X | X |
| 14 | " | " | " | 3.4 | 0.0031 | 128 | 1.4 | X | X |
| 15 | " | " | " | 3.3 | 0.0030 | 123 | 1.2 | X | X |
| 16 | Since the resulting prepreg was too tacky, laminate-molding was impossible. | | | | | | | | |

*1treatment at 300° C. for 2 min. O, no damage; X, blistering
*2boiling in trichloroethane for 15 min. O, no damage; X, rough surface

EXAMPLE 16

70 Parts of A5 was mixed with 30 parts of an epoxy resin modified butadiene-based copolymer which was prepared by heating BE7 and distilling off MIBK under vacuum, and with 0.1 part of iron acetylacetonate and 2 parts of di-t-butyl peroxide. To the mixture, 100 parts of wollastonite was added and the resulting mixture was kneaded in a kneading type extruder at 100°–110° C. to form pellets. The pellets had good blocking resistance.

The pellets were compression-molded at 170° C. and at 300 kg/cm$^2$ for 3 minutes. The molding was post-cured in an oven (at 200° C.) for 30 minutes to give a final product which had a glass transition point of 200° C., a flexural strength of 8.4 kg/mm$^2$ (at 200° C.) and 4.2 kg/mm$^2$ (at 170° C.), and a heat loss of 0.8% (at 220° C. × 100 hours).

We claim:

1. A thermosetting resin composition comprising a thermosetting cyanate ester resin composition (A) selected from the group consisting of cyanate ester resins, cyanate ester-maleimide resins, cyanate ester-maleimide-epoxy resins and cyanate ester epoxy resins; and a butadiene based copolymer (B) (i) or an epoxy resin-modified butadiene based copolymer (B) (ii), in which said components (B) (i) or (B) (ii) are used for modifying said component (A), components (A) and (B) being present in the ratio range of 95:5 to 30:70, said components (A) and (B) being as follows:
   (A) a cyanate ester thermosetting resin composition comprising at least 50% by weight of a cyanate ester compound selected from the group consisting of
   (i) a polyfunctional cyanate ester having at least two cyanato groups in its molecule and represented by the formula

   R(OCN)$_m$ wherein R is an aromatic radical and m is an integer of 2–5 and the cyanato group is directly bonded to the aromatic ring,
   (ii) a prepolymer of the cyanate ester of (i),
   (iii) a copolymer of the cyanate ester of (i) and an amine, and
   (iv) mixtures thereof;
   (B) (i) a butadiene based copolymer comprising a butadiene-aromatic vinyl monomer copolymer having a weight ratio of butadiene/aromatic vinyl monomer in the copolymer chain of 80/20–10/90, and 0.5 or more functional radicals selected from the group consisting of carboxyl radicals, hydroxyl radicals, acid anhydride radicals, mercapto radicals, epoxy radicals and amino radicals, a melting point of 10° C. or more, and wherein the 1,2-type content in the butadiene structure of the copolymer chain is 50% or more or;
   (ii) an epoxy resin-modified butadiene based copolymer comprising said butadiene based copolymer (B) (i) having a carboxyl radical modified with polyfunctional epoxy resin, wherein said copolymer (B) (ii) has a melting point of 10° C. or more and an epoxy equivalent of 300–8,000.

2. A thermosetting resin composition comprising a thermosetting cyanate ester resin composition (A) and a butadiene based copolymer (B) (i) or an epoxy resin-modified butadiene based copolymer (B) (ii), in which said components (B) (i) or (B) (ii) are used for modifying said component (A); component (A) being:
   (1) a cyanate ester thermosetting resin comprising a cyanate ester compound selected from the group consisting of
   (i) a polyfunctional cyanate ester having at least two cyanate groups in its molecule,
   (ii) a prepolymer of the cyanate ester of (i),
   (iii) a copolymer of the cyanate ester of (i) and an amine, and (iv) mixtures thereof,
said cyanate ester being represented by the formula $$R(OCN)_m \qquad (1)$$

wherein R is an aromatic nucleus-containing residue having 1-10 benzene rings derived from an aromatic hydrocarbon selected from the group consisting of benzene, biphenyl and naphthalene, residue derived from a compound in which at least two benzene rings are bonded to each other by a bridging member selected from the group consisting of

wherein $R^1$ and $R^2$ are the same or different and each represents a hydrogen atom or an alkyl group containing 1 to 4 carbon atoms,

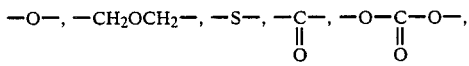

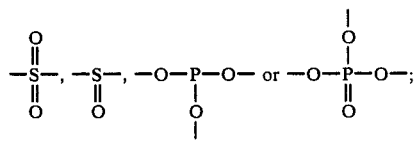

said aromatic nucleus is non-substituted or is substituted with a substitutuent selected from the group consisting of alkyl groups containing 1 to 4 carbon atoms, alkoxy groups containing 1 to 4 carbon atoms, chlorine and bromine; and m is an integer of at least 2; wherein the cyanato groups are always directly bonded to the aromatic nucleus (2) a cyanate ester-maleimide resin composition,
(3) a cyanate ester-maleimide-epoxy resin composition, or
(4) a cyanate ester-epoxy resin composition; the amount of the cyanate ester compositions (2)-(4) being more than 50% by weight, and
Component (B) being as follows:

(i) a butadiene based copolymer comprising a butadiene-aromatic vinyl monomer copolymer having 0.5 or more functional radical selected from the group consisting of carboxyl radicals, hydroxyl radicals, acid anhydride radicals, melcupto radicals, epoxy radicals and amino radicals, and having a melting point of 10° C. or more, and wherein the 1,2-type content in the butadiene structure of the copolymer chain is 50% or more and wherein, the weight ratio of butadiene to aromatic vinyl monomer in the copolymer is in the range of 80:20 to 10:90; or (ii) an epoxy resin-modified butadiene based copolymer comprising said butadiene based copolymer (B) (i) having a carboxyl radical modified with a polyfunctional epoxy resin, wherein said copolymer (B) (ii) has a melting point of 10° C. or more and an epoxy equivalent of 300-8,000, the ratio by weight of component (A) to component (B) being in the range of 95:5 to 30:70.

3. The composition of claim 1 wherein the amount of said cyanate ester compound is more than 50% by weight based on the weight bases of component (A).

4. The composition of claim 1 wherein the ratio by weight of the butadiene unit to the aromatic vinyl monomer unit in said butadiene based copolymer is in the range of 70:30 to 20:80.

5. The composition of claim 1 wherein more than 85% of the structure in the butadiene units constituting said butadiene based copolymer chain is of the 1,2-type.

6. The composition of claim 1 wherein the functional radicals contained in said butadiene based copolymer (B) (i) are selected from the group consisting of carboxyl radicals, hydroxyl radicals, acid anhydride radicals and epoxy radicals.

7. The composition of claim 1 wherein the epoxy equivalent of said epoxy resin-modified butadiene based copolymer (B) (ii) is in the range of 500-4,000.

8. The composition of claim 1 wherein the ratio by weight of component (A) to component (B) is in the range of 90:10 to 40:60.

9. The composition of claim 2 further comprising another thermosetting resin.

* * * * *